(12) United States Patent
Keranen et al.

(10) Patent No.: US 10,667,396 B2
(45) Date of Patent: May 26, 2020

(54) MULTILAYER STRUCTURE FOR HOSTING ELECTRONICS AND RELATED METHOD OF MANUFACTURE

(71) Applicant: TactoTek Oy, Oulunsalo (FI)

(72) Inventors: Antti Keranen, Oulunsalo (FI); Ronald Haag, Oulunsalo (FI); Mikko Heikkinen, Oulunsalo (FI)

(73) Assignee: TACTOTEK OY, Oulunsalo (FI)

(*) Notice: Subject to any disclaimer, the term of this patent is extended or adjusted under 35 U.S.C. 154(b) by 0 days.

(21) Appl. No.: 15/687,095

(22) Filed: Aug. 25, 2017

(65) Prior Publication Data

US 2019/0069408 A1    Feb. 28, 2019

(51) Int. Cl.
*H05K 1/18*    (2006.01)
*H05K 1/02*    (2006.01)
(Continued)

(52) U.S. Cl.
CPC ............ *H05K 1/18* (2013.01); *H05K 1/0203* (2013.01); *H05K 3/284* (2013.01); *H05K 3/4069* (2013.01); *H05K 1/0266* (2013.01); *H05K 1/0274* (2013.01); *H05K 2201/0108* (2013.01); *H05K 2201/0129* (2013.01);
(Continued)

(58) Field of Classification Search
CPC ........... H05K 1/185; H05K 2201/0129; H05K 2201/0108; H05K 2201/10106; H05K 2201/10204; H05K 1/18; H05K 1/0203; H05K 1/0393; H05K 1/0313; H05K 1/032; H05K 3/284; H05K 1/0266; G02F 1/1362
See application file for complete search history.

(56) References Cited

U.S. PATENT DOCUMENTS 4,965,227 A    10/1990    Chang et al.
5,070,510 A    12/1991    Konushi et al.
(Continued)

FOREIGN PATENT DOCUMENTS

JP      H04164391      6/1992

OTHER PUBLICATIONS

Notification of Transmittal of the International Search Report and the Written Opinion of the International Searching Authority, of the Declaration issued by the European Patent Office acting as the International Searching Authority in relation to International Application No. PCT/FI2018/050599 dated Dec. 10, 2018 (12 pages).
(Continued)

*Primary Examiner* — Roshn K Varghese
(74) *Attorney, Agent, or Firm* — Robert P. Michal, Esq.; Carter, DeLuca & Farrell LLP

(57) ABSTRACT

Integrated multilayer structure (100, 200, 300, 400, 500, 600, 700) comprising a first substrate film (102) having a first side (102A), said first substrate film comprising electrically substantially insulating material, said first substrate film preferably being formable and optionally thermoplastic, a plastic layer (112) molded onto said first side of the first substrate film so as to at least partially cover it, and circuitry (104, 106, 204, 205), optionally comprising an electronic, electromechanical and/or electro-optical component, provided on the second side of the first substrate film, said circuitry being functionally connected to the first side of the first substrate film.

21 Claims, 5 Drawing Sheets

(51) Int. Cl.
*H05K 3/40* (2006.01)
*H05K 3/28* (2006.01)

(52) U.S. Cl.
CPC .............. *H05K 2201/09563* (2013.01); *H05K 2201/10106* (2013.01); *H05K 2201/10151* (2013.01); *H05K 2203/1105* (2013.01); *H05K 2203/1316* (2013.01); *H05K 2203/1327* (2013.01)

(56) References Cited

U.S. PATENT DOCUMENTS

| | | | |
|---|---|---|---|
| 5,079,673 | A | 1/1992 | Kodai et al. |
| 5,744,758 | A | 4/1998 | Takenouchi et al. |
| 5,777,381 | A * | 7/1998 | Nishida .................. H01L 23/32 257/685 |
| 7,067,907 | B2 * | 6/2006 | Koschmieder .......... H01L 23/13 257/678 |
| 7,250,637 | B2 | 7/2007 | Shimizu et al. |
| 7,700,414 | B1 | 4/2010 | San Antonio et al. |
| 8,614,544 | B2 | 12/2013 | Suzuki et al. |
| 2004/0804294 | | 1/2004 | Hall et al. |
| 2004/0160752 | A1 * | 8/2004 | Yamashita ........ H01L 23/49894 257/E23.077 |
| 2005/0206047 | A1 | 9/2005 | Lewison |
| 2007/0035013 | A1 * | 2/2007 | Handa ................. H01L 23/5389 257/717 |
| 2008/0136990 | A1 * | 6/2008 | Kimura ............... H01L 27/1218 257/E27.111 |
| 2009/0002973 | A1 * | 1/2009 | Watanabe ................ H01L 24/18 361/820 |
| 2009/0008142 | A1 * | 1/2009 | Shimizu .................... B32B 5/18 174/261 |
| 2010/0175806 | A1 | 7/2010 | Shiraishi et al. |
| 2014/0030471 | A1 * | 1/2014 | Otsubo ................. H05K 1/183 428/76 |
| 2017/0094776 | A1 | 3/2017 | Heikkinen et al. |

OTHER PUBLICATIONS

Office Action issued in U.S. Appl. No. 16/038,864 dated Dec. 12, 2018 (9 pages).

* cited by examiner

MULTILAYER STRUCTURE FOR HOSTING ELECTRONICS AND RELATED METHOD OF MANUFACTURE

The project leading to this application has received funding from the European Union's Horizon 2020 research and innovation programmed under grant agreement No 725076.

FIELD OF THE INVENTION

Generally the present invention relates to electronics, associated devices, structures and methods of manufacture. In particular, however not exclusively, the present invention concerns provision of an integrated multilayer structure incorporating a number of electronic components arranged on a substrate film and a molded layer provided upon the film.

BACKGROUND

Generally there exists a variety of different stacked assemblies and structures in the context of electronics and electronic products.

The motivation behind the integration of electronics and related products may be as diverse as the related use contexts. Relatively often size savings, weight savings, material savings, cost savings, performance gain or just efficient cramming of components is sought for when the resulting solution ultimately exhibits a multilayer nature. In turn, the associated use scenarios may relate to product packages or food casings, visual design of device housings, wearable electronics, personal electronic devices, displays, detectors or sensors, vehicle interiors, antennae, labels, vehicle electronics, etc.

Electronics such as electronic components, ICs (integrated circuit), and conductors, may be generally provided onto a substrate element by a plurality of different techniques. For example, ready-made electronics such as various surface mount devices (SMD) may be mounted on a substrate surface that ultimately forms an inner or outer interface layer of a multilayer structure. Additionally, technologies falling under the term "printed electronics" may be applied to actually produce electronics directly and essentially additively to the associated substrate. The term "printed" refers in this context to various printing techniques capable of producing electronics/electrical elements from the printed matter, including but not limited to screen printing, flexography, and inkjet printing, through a substantially additive printing process. The used substrates may be flexible and printed materials organic, which is however, not always the case.

A substrate may be provided with electronics and overmolded by plastics so as to establish a multilayer structure with the electronics at least partially embedded in the molded layer. Accordingly the electronics may be concealed from the environment and protected against environmental conditions such as moisture, physical shocks, or dust, whereas the molded layer may further have various additional uses in terms of aesthetics, transfer medium, dimensioning, etc.

However, even when a multilayer structure is loaded with various electronics, it may still not always function completely in isolation, i.e. autonomously. Instead, various external power, data and/or control connections may have to be provided thereto, which typically requires provision of electrical connectors and related wiring even though also wireless connections might be applicable as well. In some scenarios, establishing the required physical connections and the layout of connections themselves may turn out rather complex when the target components are located deep within the multilayer structure.

Yet, high level of integration resulting from embedding electronics within a multilayer structure and e.g. insulation properties of related material layers may cause concern having regard to associated thermal management as the encapsulated components could, for example, easily overheat due to reduced cooling such as convection thereof.

Still, in some scenarios the nature of the electronics to be utilized in connection with a multilayer structure, with reference to e.g. light-emitting components, may be such that they easily disturb the functioning or degrade the appearance of the overall structure and/or other embedded elements, considering e.g. light leakage in the context of the aforementioned light-emitting components. Correspondingly, inclusion of certain electronics within a multilayer structure may prevent them from functioning in optimum or even sufficient fashion due to disturbances caused by adjacent or nearby other components or materials.

Still further, some electronic components incorporate moving parts with reference to e.g. electromechanical devices, which utilize electricity for creating the mechanical motion or vice versa. Accordingly, embedding such elements within a multilayer structure, e.g. within solid material layer, may obviously prevent the component from operating, or tedious measures have to be executed for preparing e.g. the necessary internal cavity within the structure to enable sufficient motion of the moving part(s) therein.

Further, in some applications a component such as a sensor just cannot be positioned within e.g. a closed structure to duly perform its intended function requiring interaction with the environment such as measurement of related characteristics.

Ultimately, some components may require so complex layout or generally large space or surface area that their inclusion as embedded components sandwiched between material layers is not particularly feasible in many use scenarios and contexts.

SUMMARY

The objective of the present invention is to at least alleviate one or more of the above drawbacks associated with the existing solutions in the context of integral multilayer structures and electronics embedded therein.

The objective is achieved with various embodiments of a multilayer structure and related method of manufacture in accordance with the present invention. Yet, a substrate for use in the multilayer structure and related method of manufacture are presented.

According to one embodiment of the present invention, an integrated multilayer structure comprises a first substrate film having a first side and an opposite second side, said first substrate film comprising electrically substantially insulating material, said first substrate film preferably being formable and/or thermoplastic, a plastic layer, such as thermoplastic or thermoset plastic layer, molded onto said first side of the first substrate film so as to at least partially cover it, and circuitry, preferably comprising at least one electronic, electromechanical and/or electro-optical component, provided on the second side of the first substrate film, said circuitry being functionally connected to the first side of the substrate film.

In various embodiments, a second (substrate) film may be provided on the opposite side of the molded plastics. From the standpoint of a typical but not the sole possible use scenario of the multilayer structure, the first side of the first film may be considered to face the front side of the structure so that is also configured to face a user and/or use environment of the structure or of its host device, whereupon the optional second film, when included in the structure, can be considered front film, of the structure from the perspective of the user/environment/host device, being closer to them, whereas the first film, may be correspondingly considered back film. However, a skilled person shall be reminded of a fact that in some other embodiments the questions of directionality such as 'front' or 'back' may not play a similar role (e.g. if the structure is fully embedded in the host device/host structure), or the structure may be just aligned differently than in the above scenario. The first and second films may be mutually similar or different having regard to their dimensions, materials, shapes, vias and/or other features such as components or generally circuitry hosted.

The second film, which may also (as the first film) act as a substrate for various features including e.g. graphics and/or electronics provided on first and/or second side thereof, optionally mounted and/or printed electronic components and/or traces, conductors, contact pads, masking, cooling/thermal control, or insulating elements, therefore faces the molded layer from a direction opposite to the primary, or first, substrate film. The second film may have been positioned, i.e. inserted, in a mold together with the first film enabling plastic material to be injected between them. Alternatively, the second film may have been laminated onto the molded layer by feasible lamination technology using e.g. adhesive, elevated temperature and/or pressure based bonding. In some embodiments, the second film is electrically connected to the first film by providing electrically conductive material between them. Additionally or alternatively, the films or features thereof may be electrically or electromagnetically connected to each other or e.g. external elements such as a user's hand, finger or (other) stylus wirelessly by means of related electromagnetic field or flux.

In various embodiments, the first and optional second substrate films may comprise or consist of a number of materials such as organic or biomaterials, such as wood, leather or fabric (e.g. cotton, wool, silk or linen based), or any combination of these materials with each other and/or with plastics or polymers, or metals. A film may generally consist of or at least comprise thermoplastic or other formable, such as thermoformable, material. Yet, the film material may be at least locally electrically substantially insulating, e.g. dielectric. In some other embodiments, the material may be at least locally electrically conductive. In some embodiments, the second film may have been configured with conductive (e.g. metal) and/or insulating (e.g. most plastics) material so as to control (direct, attenuate (shielding), strengthen, etc.) the characteristics of e.g. external electric field deeper in the structure.

Generally, in various embodiments there may actually be one or more mutually similar or different (substrate) films and/or other material layers on any side of the molded layer. They may carry circuitry such as a number of electronic components, traces, contact pads, shielding elements, graphics (e.g. ink or paint based pigmented shapes formed, or optical, e.g. refractive and/or diffractive, microstructures embedded), cooling elements or thermoelements, and/or other features, or be free of them. In various embodiments, graphics or a graphics layer may be provided within the structure by utilizing e.g. IML technology wherein a graphics-provided film is utilized as an insert in a mold and then overmolded such that the graphics faces the molded plastics, the graphics being thus sandwiched between the film material and molded plastics.

One or more of the included films may at least partially, i.e. at least in places, be optically substantially opaque or translucent having regard to predefined wavelengths e.g. in visible spectrum. The wavelengths may include wavelengths emitted or received by the electronics of the multilayer structure with reference to e.g. include light-emitting components and light-capturing (e.g. sensing) components, respectively. The film(s) may have been initially provided with visually distinguishable, decorative/aesthetic and/or informative, features such as graphics (e.g. symbol, sign, indicator, icon, chart, number, letter, writing, drawing, geometric design, and/or pattern) and/or generally color thereon or therein. Features such as graphics or generally optical shapes may be provided additively by coating or printing, for example, and/or through subtractive methods such as carving, drilling, embossing or generally thinning. The transmittance of a film or other element considered substantially transparent having regard to wavelengths of interest may be about 80%, 85%, 90%, 95% or higher, for example.

In some embodiments, selected, preferably embedded, features of the structure such as graphics or e.g. selected areas or volumes thereof may be illuminated by underlying light-emitting elements and/or they may be considerably reflect external light such as ambient light or other light incident thereon. Illumination may be utilized to enhance their visibility, for example. The reflectivity may be diffusive and/or specular.

In some embodiments, substantially opaque (e.g. pigmented) or translucent areas or volumes of the structure (films, other material layers or features) may, on the other hand, be configured so as to optically mask a selected underlying structure from e.g. external visual inspection and having regard to e.g. visible light and/or other wavelengths. The films or other layers may thus indeed have desired optical characteristics in terms of exhibited color, texture, transmittance (opaque, translucent, transparent) in view of target wavelengths, etc.

A plurality of films and/or other layers on any side of the molded plastic layer may be attached together through lamination (heat, pressure, adhesive, etc.) and/or by mechanical fixing means such as rivets, screws or bolts, for instance. The films may be flexible (bend reversibly) or essentially non-flexible or stiff (plastic deformation).

In various embodiments, the first and/or second film(s) may exhibit a planar shape in the structure. However, the concerned shape may alternatively be at least locally essentially three-dimensional and be established through forming such as thermoforming or cold forming to be discussed in more detail hereinafter.

In various embodiments, the first and/or second film, may comprise one or more through-film features such as vias, typically extending in the thickness direction of the film.

Preferably, the vias have been provided or essentially filled with electrically conductive material that is further preferably formable to survive e.g. (thermo)forming of the host film without suffering from at least excessive breakage having regard to desired properties thereof such as electrical conductivity. Via(s) may have been provided also in the molded and/or other material layers of the multilayer structure for the same or different purposes. For example, optical or electromagnetic vias may be provided in various layers of the structure.

In various embodiments, selected features such as traces, contact pads, electrodes and/or other type of conductors or generally conducting elements, or components, or generally circuitry, provided upon the film(s) may be or comprise at least portions that are optically opaque, translucent or substantially transparent (clear) having regard to selected wavelengths, e.g. visible light or the operating frequencies of e.g. included light-emitting or light-detecting components.

In various embodiments, e.g. printed conductors, electrodes, and/or other optionally electrically conductive elements or shapes arranged in the structure may be provided with cutouts or generally opaque material-free internal portions to enable light, e.g. from underlying light source and/or lightguide, to pass through. Accordingly, different features such as visual indicators (e.g. icon) and/or control input elements (e.g. touch sensor) may be illuminated by backlighting. For example, light source and/or related light directing means such as a lightguide may be provided on the second side of the first substrate film to arrange light towards the first side thereof whereas the cutout-provided elements such as conductors may be provided on the first side, enabling light to propagate through them via the cutout portions.

In various embodiments, the circuitry comprises at least one component selected from the group consisting of: electronic component, electro-optical component, electromechanical component, radiation-emitting component, light-emitting component, LED (light-emitting diode), OLED (organic LED), radiation detecting component, light-detecting component, photodiode, phototransistor, photovoltaic device such as cell, sensor, atmospheric sensor, gas sensor, temperature sensor, moisture sensor, micromechanical component (e.g. on the second side of the first substrate film as being appreciated by a skilled person), switch, touch switch, proximity switch, touch sensor, proximity sensor, capacitive switch, capacitive sensor, projected capacitive sensor or switch, single-electrode capacitive switch or sensor, multi-electrode capacitive switch or sensor, self-capacitance sensor, mutual capacitive sensor, inductive sensor, sensor electrode, UI element, user input element, vibration element (e.g. on the second side of the first substrate film), communication element, data processing element, and data storage element. Still, an electronic sub-assembly with e.g. a circuit board and component(s) of its own may be provided on the substrate(s) and/or other layers of the structure.

In various embodiments, the multilayer structure comprises at least one optically transmissive element such as an optical waveguide, or specifically a lightguide, configured, e.g. in terms of dimensions, materials (e.g. associated refractive indexes, transmittance), etc., so as to convey and direct incoupled light in a desired manner. The lightguide may for example guide the incoupled light to a selected direction for outcoupling via a selected exit surface thereof or reaching e.g. a photosensitive sensor or other optically functional element provided within, adjacent or at least optically coupled to the lightguide.

The lightguide may be mounted or established on the second side of the first substrate film, for example. It may be prepared and e.g. (3D) formed beforehand, and further applied in a mold e.g. as a spacer and/or barrier on the film, protecting other elements such as LED, or other light source or circuitry, associated therewith from e.g. excessive pressure caused by the mold. Instead of or in addition to the lightguide, other suitable element could be used as similar spacer or barrier as well to protect circuitry prior to molding of the plastic layer, during molding and/or afterwards. The lightguide/barrier may be provided with a hole for accommodating an element such as LED, for instance. After positioning the element in the hole, the remaining space in the hole may be filled with further protective material (e.g. suitable plastics or resin).

Similarly, in various embodiments also on the first side and e.g. on the related first surface of the first substrate film there may be provided e.g. any one or more of the aforementioned features such as electronic components, optoelectronics (e.g. LED), electromechanics, traces, contact pads, electrodes, lightguides, multi-component devices or arrangements, sensors, switches, etc.

In various embodiments, the structure comprises a further, second molded layer that has been provided on the second side and potentially at least locally contacting the associated second surface of the first substrate film. The material of the second molded layer be the same with the first molded layer on the opposite first side, or different.

Optionally, multi-material capable molding technology such as multi-shot molding may be utilized to provide several plastic layers in one process, which may also be applied to producing selected molded layer(s) of the multilayer structure suggested herein.

Generally, in various embodiments the plastic layer(s) molded onto any of the films included in the multilayer structure may comprise materials such as polymer, organic, biomaterial, composite, such as organic or graphite, as well as any feasible combination thereof. The material(s) may be or at least comprise thermoplastic material. Alternatively or additionally, the molded layer(s) may consist of or at least comprise thermosetting material.

The first side and thus the associated first surface of the substrate film has indeed been at least partially, having regard to the related surface area, overmolded by plastic, such as thermoplastic or thermosetting, material. The used molding techniques may vary between the embodiments but include e.g. injection molding and reactive molding such as reaction injective molding. The molding process may optionally be of the aforementioned multi-material and/or as multi-shot type. Low-pressure molding may be applied to prevent damaging the underlying electronics by excessive pressure, for example. Similar considerations generally apply to the second side and associated surface, which may have been at least partially subjected to molding such as low-pressure molding to cover and protect underlying circuitry. Optionally, several molding materials may be utilized to establish one or more molded layers, e.g. adjacent layers lying side-to-side on the first and/or second side of the substrate and/or forming a stack of multiple superposed layers thereon. One or more components and/or other circuitry established (printed, for example), mounted or otherwise provided to any side of the substrate film, may have been at least partially overmolded by the applied molding procedure.

In some embodiments, material(s) used to establish the molded layer(s) may comprise optically substantially opaque, transparent and/or translucent material. Transparent or translucent material may be utilized to enable e.g. visible light or electromagnetic radiation of other selected wavelengths to pass through it with negligible loss. The sufficient transmittance providing substantial transparency at desired wavelengths may be about 70%, 75%, 80%, 85%, 90% or 95% or higher, for example, depending on the embodiment.

Yet, a system comprising an embodiment of the multilayer structure and an embodiment of optionally host type structure or device accommodating or at least functionally connecting to the multilayer structure may be provided.

The optionally host type structure or device functionally and/or physically (e.g. mechanically) connected to an embodiment of the multilayer structure in accordance with the present invention may include at least one element selected from the group consisting of: electronic terminal device, portable terminal device, hand-held terminal device or controller, personal electronic device, vehicle, car, truck, airplane, helicopter, in-vehicle electronics, vehicle dashboard, vehicle exterior, vehicle interior element, vehicle interior panel, vehicle lighting device, measurement device, computer device, intelligent garment (e.g. shirt, jacket, or trousers, or e.g. a compression garment), other piece of wearable electronics (e.g. wristop device, headwear, or footwear), multimedia device or player, industrial machinery, controller device, personal communications device (e.g. smartphone, phablet or tablet) or other electronics.

According to one other embodiment of the present invention, a method for manufacturing a multilayer structure, comprises obtaining a first substrate film for accommodating electronics, said first substrate film having a first side optionally facing a predefined front side of the structure, said first side of the first substrate film being preferably configured to face a user and/or use environment of the structure or of its host device, and an opposite second side, said first substrate film comprising electrically substantially insulating material, said first substrate film preferably being formable and/or thermoplastic, providing, optionally by mounting and/or by printed electronics technology, circuitry on at least said second side of the first substrate film, said circuitry being functionally connected to the first side of the first substrate film, and molding plastic material on the first side of the first substrate film so as to at least partly cover it.

As alluded to hereinbefore, in some embodiments, further (substrate) films and/or other material layers may be provided in the structure, used e.g. as an insert in a molding procedure, laminated onto an existing layer, or established directly into the structure by molding or printing, for example.

Thereby, e.g. a second film may be optionally provided on the other side of the molded plastic as mentioned hereinbefore. It may be located in a mold together with the first substrate so that a stacked structure is obtained by injecting the plastic material in between, or the second film may be provided afterwards using a suitable lamination technique if not being directly manufactured on the molded plastic layer. The second film may also be provided with electronics on any side thereof (e.g. facing the molded plastic layer) as well as e.g. graphics (application of e.g. IML technique being thus possible). Yet, it may have a protective purpose and/or other technical characteristics such as desired optical transmittance, appearance (e.g. color) or feel.

The feasible molding methods include e.g. injection molding in connection with e.g. thermoplastic materials and reactive molding such as reaction injection molding especially in connection with thermosets. In case of several plastic materials, they may be molded using a two-shot or generally multi-shot molding method. A molding machine with multiple molding units may be utilized. Alternatively, multiple machines or a single re-configurable machine could be used for sequentially providing several materials.

Having regard to applicable molding techniques and parameters, e.g. the aforementioned injection molding and reactive molding are indeed feasible options depending on the used materials, desired material properties, molding equipment, etc. To cause minimum stress to the underlying features such as electronics, low-pressure (e.g. less than about 10 bar) molding may be used in selected molding operations, such as overmolding of the second side of the first substrate as well as circuitry thereon. Different molding techniques may be applied to yield different material properties to the structure in terms of e.g. desired mechanical properties such as strength.

In various embodiments, one or more substrate films may be formed, optionally thermoformed, to exhibit a desired, typically at least locally three-dimensional (3D) target shape (see FIG. 1A) instead of substantially flat shape, preferably following the provision of circuitry such as a number of components, electrodes, conductors and/or contact pads thereon. The materials, dimensions, positioning and other configuration of the elements such as electronics already residing on the film prior to molding shall be selected so as to withstand the forces induced thereto by forming without breakage.

In various embodiments, a number of features such as traces, contact pads, further conductive elements, other circuitry such as supplementary components, lightguides, and/or graphics or graphics layers may be provided, optionally by printed electronics technology such as screen printing or ink jetting, mounting, depositing, laminating and/or other applicable technique(s), to the multilayer structure. For example, traces may be printed on a substrate film to connect components. As being appreciated by a person skilled in the art, e.g. traces and contact pads may be often more practical to provide prior to the components build or mounted thereupon.

In various embodiments, a number of vias may be established in the film(s) for e.g. electrically connecting the first and second sides thereof together, in practice referring to e.g. electronics on both sides of the concerned film together.

Generally, the vias or generally through-holes in the film(s) and/or other layers of the structure may be provided by molding (or generally, directly establishing the substrate film with the hole), drilling, chemically (through etching, for example), carving, sawing, etching, cutting (e.g. with laser or mechanical blade) or using any other feasible method as being understood by a person skilled in the art. The vias may have a desired cross-sectional shape, i.e. a substantially circular or angular shape, e.g. a rectangular shape, or elongated (slit) shape.

The vias may be provided with selected material(s) such as electrically conductive and/or optically transmissive materials using a selected filling method such as molding, mounting or printing. The materials may include adhesives, epoxies, metals, conductive ink, etc. The material may be formable so that it withstands e.g. bending strain.

In various embodiments, also a number of blind holes or thinned portions may be provided in the film(s) and/or other layers by carving, molding, drilling, etc. Such hole may be configured to establish or accommodate e.g. electronic components, conductive or insulating elements, graphics, or fluidic matter (e.g. liquid and/or gaseous matter).

Still, in various embodiments of the method, also the second side and related second surface of the first substrate film may be overmolded at least partly by at least one material. For example, low-pressure molding may be utilized to protect underlying elements such as components or other circuitry as contemplated hereinearlier.

The electronics provided in the multilayer structure may have control, measurement, UI, data processing, storage, etc. purpose as discussed hereinelsewhere.

The mutual execution order of various method items may vary and be determined case-specifically in each particular embodiment. For example, the second side of the first substrate film may be overmolded prior to the first side, after the first side or substantially simultaneously; for instance, molded material may be injected so that it propagates from the initial side to the opposite side of the film e.g. via an existing or pressure-induced through-hole therein.

The previously presented considerations concerning the various embodiments of the multilayer structure may be flexibly applied to the embodiments of the related manufacturing method mutatis mutandis, and vice versa, as being appreciated by a skilled person. Yet, various embodiments and related features may be flexibly combined by a person skilled in the art to come up with preferred combinations of features generally disclosed herein.

Still in a further embodiment relating to many aspects discussed above, a substrate film for hosting e.g. aforementioned circuitry and/or other features, and comprising or essentially consisting of formable, optionally thermoformable material such as thermoplastic material, or thermoset material, may be provided. The substrate film further comprises at least one via filled with formable and preferably electrically conductive material or element of such material to electrically couple the opposing first and second sides (and thus respective surfaces) of the film to each other.

The film and via(s) may generally have properties discussed hereinbefore. The film may be substantially planar, or it may be at least locally substantially three-dimensional following a forming such as thermoforming or cold forming procedure. Yet, the film may carry electronics such as various components, traces, pads, electrodes, etc. on any side thereof, whereupon the via(s) may have been arranged to electrically and thus operatively to mutually connect the same. Still, one or more vias, or generally through-holes, may have been additionally or alternatively filled with e.g. optically transmissive material, which may further be electrically conductive or insulating. Preferably, the fill material of the via(s) withstands both forming and (over)molding possibly performed to the film after provision of at least one via and related fill thereof.

Yet, a method for producing an embodiment of the above substrate film may be provided, wherein the via is produced by molding or drilling, for example, followed by filling it with the selected preferably electrically conductive material such as conductive (e.g. silver) ink through printing or other suitable filling method. In some embodiments, establishing and filling the via may be combined into a single procedure.

The above substrate film and related method of manufacture may naturally establish a portion of an embodiment of the aforediscussed multilayer structure or associated manufacturing method, respectively. However, the film and related method may find use also in other use scenarios and contexts independently, as being easily understood by a person skilled in the art.

The utility of the present invention arises from a plurality of issues depending on the embodiment.

By introducing electronic components and potential other features such as related traces, pads, electrodes, or optics on the second, which is in many use scenarios 'back', side of the substrate film (the opposite first, or 'front', side being overmolded by plastic material and facing the user/use environment of the structure), various concerns regarding thermal management of the components can be greatly alleviated. In practice, e.g. the risk of overheating may be reduced in high power and similar applications, which are often associated with considerable thermal loads. Yet, options for delicate thermal control of the features are improved.

In addition, placing components on the second side of the substrate film, which may also define an (inner) exterior surface or at least be close to the surface of the multilayer structure, connections to external elements such as a host device or host structure may be simpler to establish. Also connections between the components on the second side may be mutually easier to implement when the components and the support surfaces for the connection elements such as traces are closer to structure exterior and their accessibility increases.

In some embodiments, by locating a component that might disturb, when placed on the first side of the substrate film and potentially embedded in the plastics, the function of other components or generally of the multilayer structure with reference to e.g. electrical noise or optical disturbances such as light leakage to nearby components or layers, on the second side the detrimental effect of the component could be avoided or at least reduced. The substrate film may act as an additional shielding or barrier layer in those cases, for example.

In some embodiments, sensitive components such as various sensing electronics which might malfunction if located too close to other components on the first side of the substrate may work flawlessly if positioned on the second side. Likewise, certain electronics such as atmospheric sensors may require direct exposure to ambient medium such as air to be measured, whereupon they should not be embedded in the plastics on the first side of the substrate, but provided on the second side instead without overlaid, measurement-disturbing layers.

In some embodiments, moving components or components incorporating moving part(s) may be disposed on the second side of the substrate film to avoid preventing them from proper functioning due to e.g. limiting effect of overmolded plastics or other tightly adjoined layers on the first side.

In some embodiments, components requiring particularly complex layout or generally large space or surface area are more practical to dispose on the external, i.e. second, side and related surface of the substrate film and potentially thus of the whole multilayer structure.

The suggested manufacturing method applying overmolding is relatively straightforward to adopt and what is further considered beneficial, does not necessitate developing completely new or particularly complex manufacturing technologies if relying on e.g. printed and in-mold electronics. By (thermo)forming the film(s) to a desired 3D shape after the provision of electronics, vias and e.g. conductors thereon while the substrate film was still substantially planar, may further reduce or obviate a need for burdensome 3D assembly of electronics on a substrate and other 3D intensive processing.

Generally, the obtained multilayer structure may be used to establish a desired device, or e.g. a module in a host device or host structure such as an intelligent garment (e.g. shirt, jacket, or trousers, or e.g. a compression garment), other piece of wearable electronics (e.g. wristop device, headwear, or footwear), vehicle such as vehicle exterior or interior (e.g. in-vehicle electronics), personal communications device (e.g. smartphone, phablet or tablet) or other electronics as described herein. The integration level of the obtained structure may be high and desired dimensions such as the thickness thereof small.

The used film(s) may be configured to carry graphics and other visually and/or tactilely detectable features thereon, whereupon the film may have aesthetic and/or informative effect in addition to hosting and protecting the electronics. The film(s) may be translucent or opaque at least in places. They may exhibit a desired color.

The obtained multilayer structure may thus generally incorporate one or more color/colored layers that optionally determine graphics such as text, pictures, symbols, patterns, etc. These layers may be implemented by dedicated films of certain color(s), for instance, or provided as coatings (e.g. through printing) on existing film(s), molded layer(s), and/or other surfaces.

The film(s) and/or the molded layer may be configured to establish at least a portion of outer and/or inner surface of the associated host device or other coupled structure.

The visual features such as patterns or coloring may be provided via internal layers, e.g. on the side of the first and/or potential second film that is facing the molded plastics so that the features remain isolated and thus protected from the environmental effects at least by the thickness of the film. Accordingly, different impacts, rubbing, chemicals, etc. that could easily damage e.g. painted surface features do not normally reach them.

The film(s) may be easily manufactured or processed, optionally cut, into a desired shape with necessary characteristics such as holes or notches for exposing the underlying features such as the molded material and/or establishing e.g. electrically or optically conductive vias.

The molded plastic material(s) may be optimized for various purposes including securing electronics in view of the molding process. Yet, the material may be configured to protect the electronics from e.g. environmental conditions such as moisture, heat, cold, dirt, shocks, etc. It may further have desired properties in view of light transmittance and/or elasticity, for example. In case the embedded electronics includes light- or other radiation-emitting or receiving components, the material may have sufficient transmittance to enable e.g. light transmission therethrough. The molded material may originally exhibit a number of colors or it may be colored afterwards by ink, paint or film coating, for example.

The expression "a number of" may herein refer to any positive integer starting from one (1).

The expression "a plurality of" may refer to any positive integer starting from two (2), respectively.

The terms "first" and "second" are herein used to distinguish one element from other element, and not to specially prioritize or order them, if not otherwise explicitly stated.

Different embodiments of the present invention are disclosed in the attached dependent claims.

BRIEF DESCRIPTION OF THE DRAWINGS

Next the present invention will be described in greater detail with reference to the accompanying drawings, in which.

DETAILED DESCRIPTION

Figure 1A:
FIG. 1A illustrates one embodiment of a flexible substrate having a three-dimensional (3D) target shape.
Figure 1:
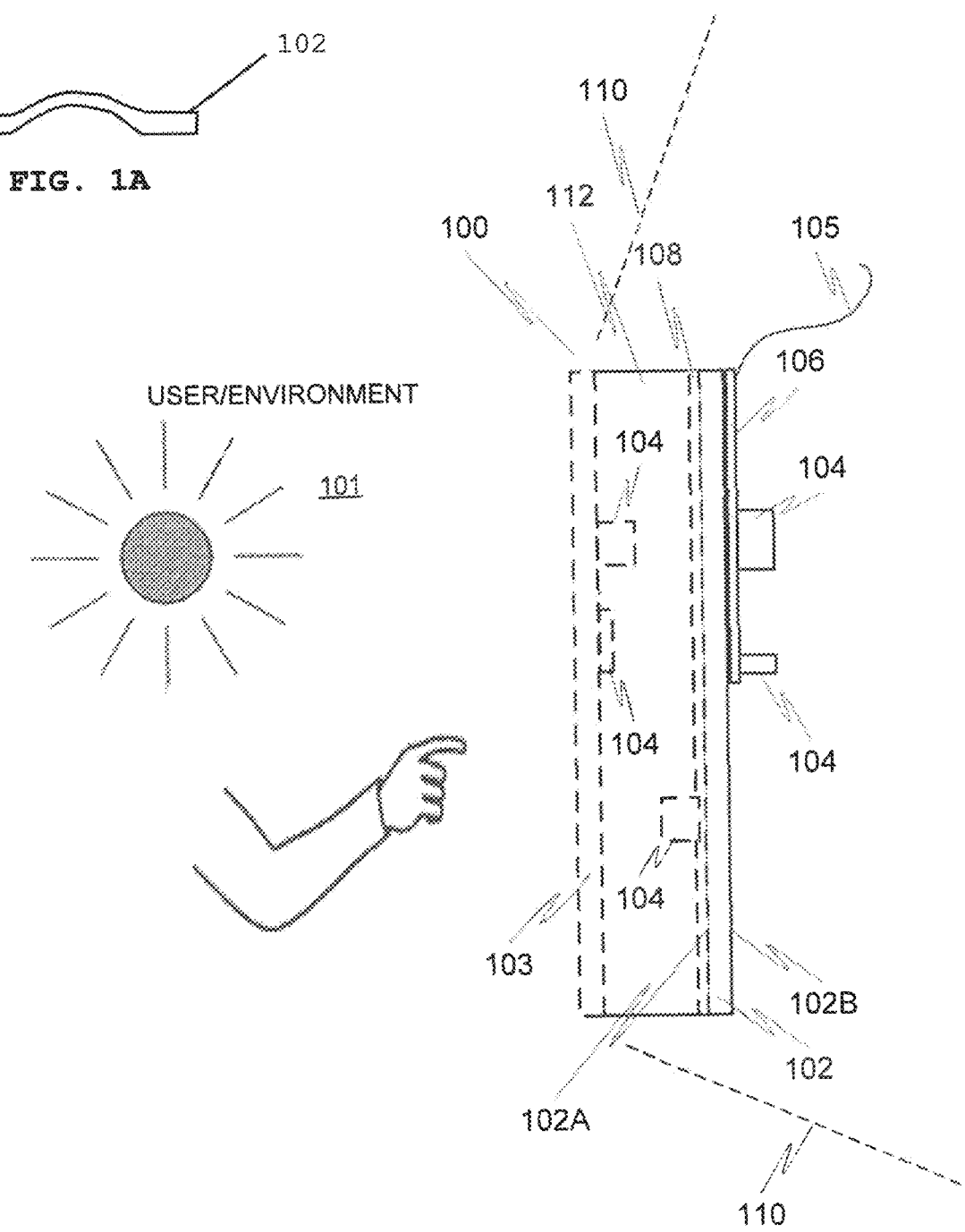
FIG. 1 illustrates one embodiment of a multilayer structure and potential related use environment in accordance with the present invention.

FIG. 1 illustrates, by means of a cross-sectional side view, many general concepts of various embodiments of the present invention via one, merely exemplary, realization of a multilayer structure at 100. Item 101 refers to potential use environment (outdoors, indoors, in-vehicle, etc.) and human user (if any) of the structure 100 located in the environment, whereas item 110 indicated by broken contour lines refers to a host device or host structure 110.

The finished multilayer structure 100 may indeed establish an end product of its own, e.g. electronic device, or be disposed in a host device as an aggregate part or module. Item 110 may naturally comprise a number of further elements or layers not shown in the figure.

The structure 100 contains at least one substrate film 102 accommodating a number of electronic components 104 on a second side 102B thereof (which may in many, but not all, feasible use cases thus be considered as back exterior side, when the first side, or 'front' side 102A, may be considered to face the intended use environment and user 101). The second side 102A may thus face and be potentially integrated with or even at least partially embedded in a possible host device or structure 110 as shown in the figure, or face e.g. the environment but nevertheless point at substantially opposite direction than the first side 102A. For example, circuitry such as a number of components 104 may have been directly manufactured such as printed on the substrate 102, optionally by means of printed electronics technology such as screen printing, tampo printing, flexography or ink jetting.

The components 104 provided on the second side 102B are preferably functionally, or 'operatively', connected to the first side 102A and in many cases all the way to the environment 101 as they 104 may be configured to sense events or characteristics of the environment 101 such as user actions (e.g. touch or proximity/contactless input) or e.g. lighting conditions or other optical or electric/electromagnetic characteristics, or respectively emit light or other form of radiation thereto, for instance. Yet, components 104 on both sides and related surfaces of the film 102 may be optically or electrically, for instance, connected to each other for various reasons such as signalling (communication) or power transfer. The functional connections (electrical, optical and/or electromagnetic, for instance) referred to herein may be direct or indirect, i.e. without or with intermediate components or elements.

The circuitry may comprise a number of further elements 106 such as electrically conductive contact pads or traces (conductors) provided, optionally by printed electronics technology, on the second side 102B to arrange e.g. electrical connections to and/or between the components 104. At least part of the elements 106 may be at least locally positioned between the film surface and the concerned component(s) 104. For instance, the "contact pad" may refer herein to any electrically conductive element or a patch, or a point or area of electrical coupling on a substrate film. The contact pad as well as other conductors or traces may comprise or be made of conductive material(s), such as copper, silver, aluminum, or conductive elastomer, comprising e.g. carbon or other conductive particles, or other such materials which may optionally enhance the visual quality of the surface on or within which the pad resides. The shape of the contact pad may be any suitable geometric shape.

In addition to or instead of printed versions, the components 104 may include ready-made components (surface-) mounted on the substrate 102, such as so-called surface-mounted elements. For example, adhesive may be utilized for mechanically securing the electronics on the substrate. Additional conductive material(s) such as conductive adhesive and/or solder may have been applied for establishing electrical and also mechanical connections between various elements such as conductor traces 106 and components 104.

The components 104 may thereby include passive components, active components, ICs (integrated circuit), printed, such as screen printed, components and/or electronic sub-assemblies as contemplated hereinbefore. For instance, one or more components may be first provided on a separate substrate, e.g. a circuit board such as an FPC (flexible printed circuit) or e.g. rigid, e.g. FR4 type (flame retardant), board, and subsequently attached as a whole (i.e. as a sub-assembly) to the target substrate 102.

As alluded to above, the structure 100 and specifically e.g. electronics 104, 106 integrated therewith may be operatively connected, instead or in addition to possible mechanical fixing, to external elements such as the host device or structure 110 wirelessly (e.g. by means of optical, ultrasound, radio frequencies, capacitive or inductive coupling) and/or wiredly. In the latter case, suitable connecting elements 105 such as electrical or optical wiring, connectors, cables, etc. may be utilized. The external connection(s) may be conveniently implemented on the second side 102B of the film 102, for example.

In various embodiments, the connecting element 105 may comprise a circuit board such as a printed circuit board optionally of flex or rigid (e.g. FR4) type. In various embodiments, the connecting element 105 may comprise at least one electronic component, such as a transistor or an integrated circuit (IC), e.g. an operational amplifier (which could naturally also be constructed from individual components). The connecting element 105 may be thus configured to accommodate components that are harder or practically impossible to mount or fabricate on a film type, typically rather thin and flexible, substrate, for example. The connecting element 105 may be secured to the substrate film 102 using e.g. adhesive, paste, conductive adhesive, mechanical fixing means, etc. E.g. electrical connection between the actual circuit design on the substrate film 102 and the connecting element 105 may be implemented, for example, by the same or dedicated feature such as solder, conductive adhesive or paste, wiring, contact areas/pads, pins, flex cable and/or element of anisotropic material having regard to electrical conductivity, optionally ACF (anisotropic conductive film).

Reverting to the components 104 preferably of at least partially electronic or electrical nature, they may, among other options, include at least one electronic element selected from the group consisting of: optoelectronic component, microcontroller, microprocessor, signal processor, DSP (digital signal processor), sensor, switch, touch switch, proximity switch, programmable logic chip, memory, transistor, resistor, capacitor, inductor, capacitive switch, electrode element, memory array, memory chip, data interface, transceiver, wireless transceiver, transmitter, receiver, wireless transmitter, and wireless receiver.

Still, the components 104 hosted by the structure 100 may include at least one optoelectronic component. The at least one optoelectronic component may include a LED (light-emitting diode), an OLED (organic LED), or some other light-emitting component, for example. The components may be side-emitting ('side shooting' or 'side-firing'), bottom-emitting or top-emitting. Alternatively or additionally, the components 104 may include a light-receiving or light-sensitive component such as a photodiode, photoresistor, other photodetector, or e.g. a photovoltaic cell. The optoelectronic component such as OLED may have been, instead of mounting, printed on the substrate film 102 using a preferred method of printed electronics technology. Indeed, e.g. different sensing and/or other functionalities may be implemented by the embedded ICs, dedicated components, shared ICs/electronics (multi-purpose electronics), and/or other circuitry. The substrate film 102 and electronics 104, 106 thereat may be configured so as to establish a desired circuit design.

Molded plastic layer 112 is provided at least on the first side 102A of the film 102. There may be further components 104 and other features (lightguides, graphical features, traces, contact pads, etc.) provided on the first side 102A and related surface of the film 102. Accordingly, components 104, other circuitry and/or further features on the first side 102A may be at least partially embedded in the molded material 104. In some embodiments though, discussed also hereinafter, also the second side 102B of the film 102 may be at least partially overmolded, optionally so as to embed one or more components 104 and/or other features 106 (e.g. traces, contact pads, electrodes, heat sink or other cooling element/thermoelement) at least partially in the molded material. The used molding techniques and parameters may vary between the sides 102A, 102B. To avoid causing pressure or thermal damage to components 104, for example, low pressure molding (e.g. preferably less than about 15 bar pressure, more preferably less than about 10 bar) may be utilized to embed them. Optionally, also high(er) pressure molding may be subsequently applied to introduce further layers to the stacked structure 100.

An optional second film 103 of same or different material(s) with the first film 102 may be present in the multilayer stack as well. The film 103 may also accommodate electronics 104, graphics and/or other features considered advantageous on the second (shown) and/or first (exterior, potentially directly facing and contacting the environment 101) sides and surfaces thereof.

Further films and/or other material layers such as graphics or colored films or layers, coatings, etc. 108 may be optionally provided on either side of any film 102, 103 e.g. for aesthetic, protective/insulating, electrical and/or other purposes.

Having regard to the material selections, the film(s) 102, 103 may substantially consist of or comprise at least one material selected from the group consisting of: polymer, thermoplastic material, copolyester, PMMA (Polymethyl methacrylate), Poly Carbonate (PC), polyimide, a copolymer of Methyl Methacrylate and Styrene (MS resin), glass, Polyethylene Terephthalate (PET), carbon fiber, organic material, biomaterial, leather, wood, textile, fabric and metal. Also copolyester resin materials (e.g. Durastar™) may be utilized in connection with the present invention e.g. in the substrate films 102, 103 and/or other elements of the structure (e.g. as molded material). The material(s) used may be at least locally electrically conductive or more typically, insulating. Yet, the optical properties may vary depending on the embodiment having regard to opacity/transparency, transmittance, etc.

In various embodiments, the film(s) 102, 103 may be flexible and thus be versatilely handled such as bent without breaking during the manufacture of the structure 100, for instance. Yet, their material may be selected so as to adopt and retain a new shape responsive to e.g. thermoforming or cold forming procedure.

The film(s) 102, 103 may be shaped according to the requirements set by each use scenario. They 102, 103 may exhibit e.g. a rectangular, circular, or square general shape. They 102, 103 may be substantially imperforate or contain recesses, notches, vias, cuts or openings, optionally filled with other material(s), for various purposes such as attachment to other elements, conducting electricity and e.g. related electrical power or other signals, fitting electronics or other components, provision of passages for light or other radiation, fluid, etc.

One or more layer(s) 112, preferably provided by the overmolding procedure (technology-wise using e.g. injection molding) on any side of the film 102 but preferably at least on the first side 102A, may generally incorporate, among other options, elastomeric resin. In more detail, the layer(s) 112 may include one or more thermoplastic materials that include at least one material selected from the group consisting of: PC, PMMA, ABS (acrylonitrile butadiene styrene), copolyester, copolyester resin, PET (polyethylene terephthalate), nylon (PA, polyamide), PP (polypropylene), TPU (thermoplastic polyurethane), polystyrene (GPPS), TPSiV (thermoplastic silicone vulcanizate), and MS resin. In some embodiments, thermoset materials may be alternatively or additionally utilized together with suitable molding methods such as reactive molding.

The film layer(s) 102, 103 as well as plastic layer(s) 112 or potential further layers 108 (paint, ink, adhesive, film(s), etc.) may be configured to exhibit a desired color or graphical pattern, which may be externally perceivable. For example, IML (in-mold labeling) procedures may be utilized to arrange embedded graphics in the structure 100.

Figure 2:
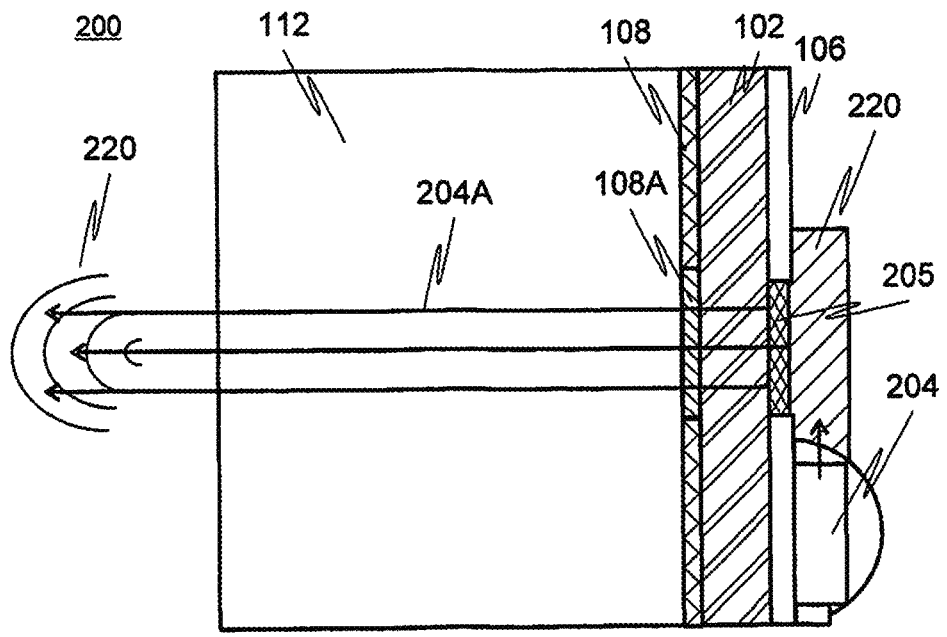
FIG. 2 illustrates another embodiment of the multilayer structure.

FIG. 2 illustrates, at 200, another embodiment of the multilayer structure in accordance with the present invention. The embodiment may implement e.g. a touch or proximity switch (sensor) functionality with related illuminated icon or other graphics, or generally with visual guiding means.

The second side of the film 102 has been provided with circuit design including a number of components 104, comprising at least one light-emitting component (light source) such as LED 204, which may be e.g. side shooting having regard to the contact/support surface thereof, as well as further elements, e.g. contact pads and/or traces 106. Sensing electronics such as mutual capacitive or self-capacitance sensors or sensing switches with a necessary number of sensing electrodes 205 and e.g. control electronics may be additionally included in the mounted or manufactured electronic components 104.

In this example, the first side of the film 102 may remain essentially free from electronics but contains a graphics layer 108 with e.g. icon 108A or other visual, decorative and/or informative, feature to be illuminated by the component 204 and established by coloring, coating, cutting, thinning, and/or shaping the (material of the) layer 108 accordingly, for example. The feature 108A may at least locally be optically transmissive such as substantially transparent or translucent having regard to the used material(s), and/or include e.g. cutouts to enable light to pass through. The feature 108A may visually indicate the nature of the control input associated with the switch 205, for example, via a characterizing icon and/or text. In some embodiments the layer 108 may comprise e.g. transparent or opaque (masking) material, for example, whereupon the feature 108A may have been at least partially implemented by translucent/opaque or transparent/translucent material, respectively. In some embodiments, the layer 108 comprises material only at feature 108A.

In contrast to the scenario explicitly depicted in the figure, a person skilled in the art will appreciate that in some alternative or supplementary embodiments of the multilayer structure at least one light source 204 provided on the second side 102B of the film 102 and optional light directing or conveying element(s) in the optical path thereof may be configured so that the light emitted by the source 204 is at least partially directed substantially away from the film 102, not towards or through it.

In any of the features 104, 106 e.g. optically clear (substantially transparent or at least translucent) conductors may be utilized to allow light emitted by the component 204 to shine through the switch area and the printed graphics on the other side of the film. Electrode(s) 205 of the switch(es) 104 may be sufficiently transparent or translucent as well. Alternatively or additionally, essentially solid switches such as self-capacitance switches can also be used, having e.g. cutout(s) for allowing the light to go through.

A further optical device such as a lightguide 220 or other light-conveying or directing member may be provided such as laminated or heat staked, for example, to the back of the substrate film 102. The lightguide 220 may be uniquely formed to follow e.g. the contour of the in-molded electronic and general structure 200. The lightguide 220 may be configured to propagate the incoupled light emitted by the component 204 therewithin, and outcouple the light through a selected surface towards the user and use environment and e.g. graphical icon or other feature 108A to be illuminated in the associated optical path. For example, the lightguide 220 may be first formed as solid sheet, which may be then processed such as die cut or punched out to allow for hole for light source such as LED placement. In some embodiments, the lightguide 220 may thus at least partially encompass or neighbour the light source 204.

Accordingly, the light-emitting component 204 may be positioned as desired on the film 102 e.g. to reduce its visibility from the use environment (it 204 may be located behind the masking material provided by layer 108, for example) and/or to reduce perceivable hot spots easily arising from both direct and diffuse light reaching the user from within the structure 200. Item 204A refers to diffuse light emitted by the lightguide 220, propagating in the molded layer 204A and finally exiting into the use environment where the user is. The touch or proximity sensing electronics 205, icon 108A and lighting arrangement 204, 220, 204A may be mutually configured so as to at least roughly indicate the location of a touch field or generally gesture field 220 for registering user input in the use environment.

In this embodiment, connection such as electrical connection to external elements, such as electronics of a host device, may be provided optionally exclusively via the backside of the structure 200, e.g. the second (back) side of the film 102 shown on the right. The connection may involve e.g. connective tail (e.g. flex cable or film), rigid connector and/or just conductive pads.

Single film concept implies a low cost option for manufacture. In addition, the molded plastics 112 on the first side of the film 102 and thus potentially front side of the overall structure or part provides for applications where e.g. water or moisture sensitivity on a surface may be of a concern.

Figure 3:
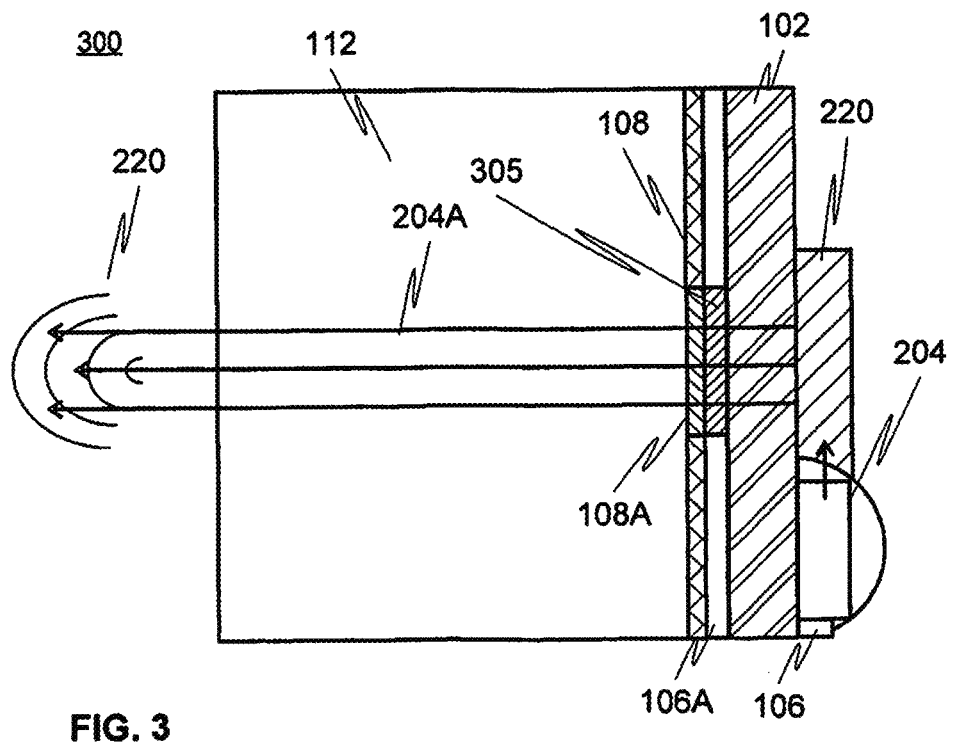
FIG. 3 illustrates a further embodiment of the multilayer structure.

FIG. 3 illustrates, at 300, a further embodiment of the multilayer structure, which is generally rather similar to the one of FIG. 1, but there is circuitry, e.g. for the aforementioned switch, on the first side of the substrate film 102, such as substantially clear (transparent or at least translucent) electrode 305 and e.g. conductor traces and/or pads 106A to pass the light emitted by the light source 204 on the second side. Any of the feature(s) 106A, 305 may be alternatively or additionally provided with opaque conductive material as well as a number of cutout areas or volumes, enabling light to pass through; for example, printed otherwise solid, optically substantially opaque, conductor/electrode areas may incorporate such cutouts defining preferred shapes for e.g. illuminated indicator type icons. Electrical connection is established to the electronics on both sides of the film 102, which may be done separately to the sides via the edges of the structure and related wiring, for instance. By the solution, switch circuitry and/or other electronics on the first side of the film 102 may be isolated from e.g. LED or other light-emitting electronics on the second side, utilizing the film 102 also as electrical insulator.

Figure 4:
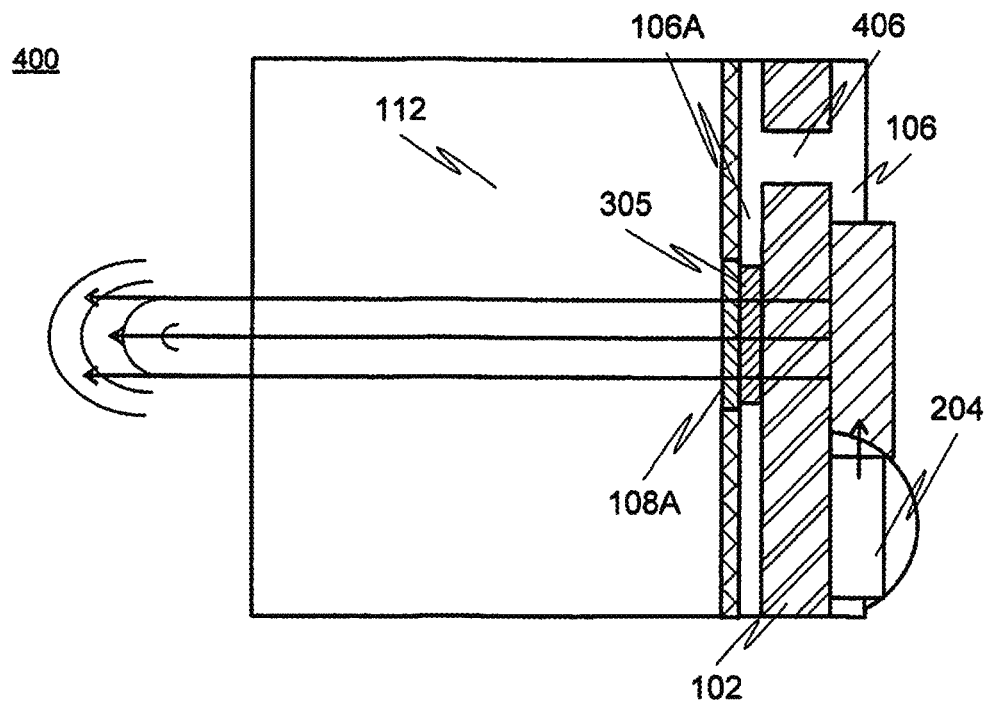
FIG. 4 illustrates still a further embodiment of the multilayer structure.

FIG. 4 illustrates, at 400, still a further embodiment of the multilayer structure, which again only moderately differs from the previous one. One difference is that the electrical connections between the electronics on both sides of the film 102 are established by a number of conductive vias 406, i.e. (pre-cut or otherwise established) through-holes in the film 102, provided with electrically conductive material such as conductive ink, for example. In some embodiments, e.g. conductive metal such as silver may be printed into existing through-holes to render them conductive vias 406. Alternatively, e.g. flexible conductor or flex cable could be threaded through the film 102 via applicable slit or generally through-hole.

Thus in some embodiments involving electrical connection to external elements it may be necessary to only connect the second side of the film 102 directly to an external element such as host device as discussed in connection with the previous embodiment in contrast to connecting both sides of the film 102 therewith separately. The connection between the first side of the film 102 and external element may be established by means of the intermediate via(s) and connecting element(s) on the second side.

Further in some embodiments, a number of dielectric/insulating, or sealer, layers may be utilized to ensure stable thru-hole design, also allowing for better formability.

Figure 5:
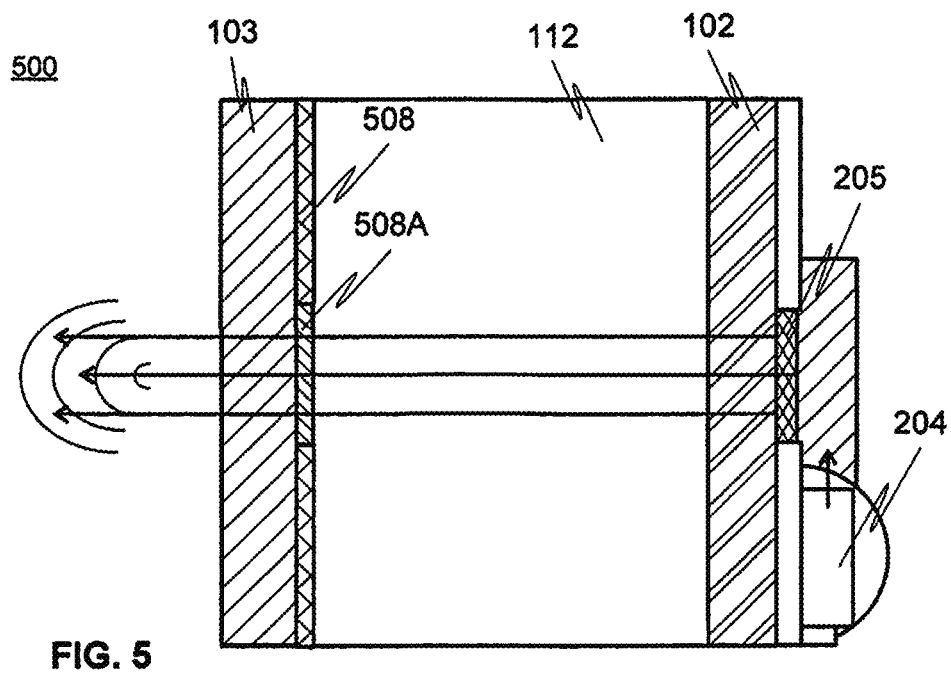
FIG. 5 illustrates yet a further embodiment of the multilayer structure.

FIG. 5 illustrates, at 500, yet a further embodiment of the multilayer structure generally again reminding of the previous ones but carrying e.g. graphics on an additional second film 103 positioned in front of the molded layer 112, i.e. on the other side relative to the first film 102. The design thereby comprises at least two films 102, 103 between which the molded plastic layer 112 is positioned. The second film 103 facing the first side of the first film 102 on other side of the molded plastic layer 112 accommodates or is adjacent to a graphics layer 508 incorporating the icon or other visual feature 508A generally in accordance to what has already been expressed in connection with the description of FIG. 2. This embodiment may yield e.g. improved imaging capabilities due to reduced haze and shadowing effect of the remaining structure on the feature 508A. The graphics layer 508 and related features 508A may be located on the second side of the film 103 (shown) and/or on the first side directly facing the use environment (not shown in the figure).

The two films 102, 103 may contain or be of mutually same or different materials. For example, in some embodiments the back, first film 102 could be of plastic material whereas the front, second film 103 could contain e.g. metal, textile/fabric or organic/biomaterial such as wood or leather. Generally, the material of the second film 103 could be selected, besides based on aforediscussed technical properties, based on aesthetics or tactile properties, such as touch feel, due to being in quite many embodiments well visible to the user and/or touchable.

Figure 6:
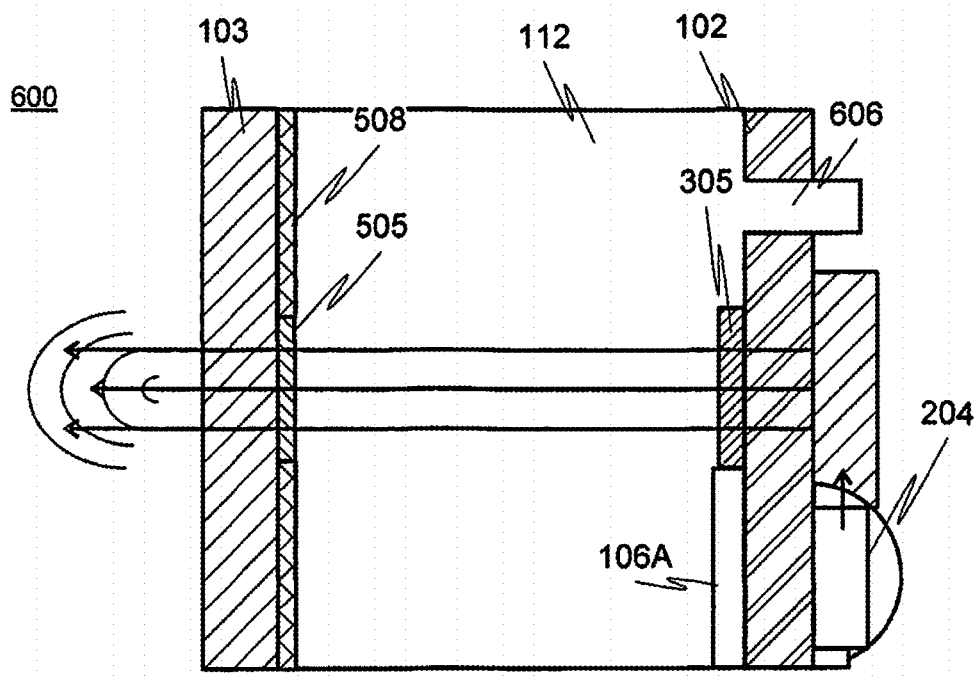
FIG. 6 illustrates a further embodiment of the multilayer structure.

FIG. 6 illustrates, at 600, a further, slightly modified, embodiment of the multilayer structure. A switch electrode 305 has been positioned on the first side of the first substrate film 102. A number of conductive vias as deliberated in connection with the description of FIG. 4 could be applied also here. Item 606 refers to features on the second side of film 102, extending through the film 102 to the first side for injection (molding) or e.g. attachment purposes. In some embodiments, the item 606 may refer to extension or protrusion formed from the molded material 112 itself to the film 102. The item 606 may thus incorporate a through-hole filled with solid material.

Figure 7:
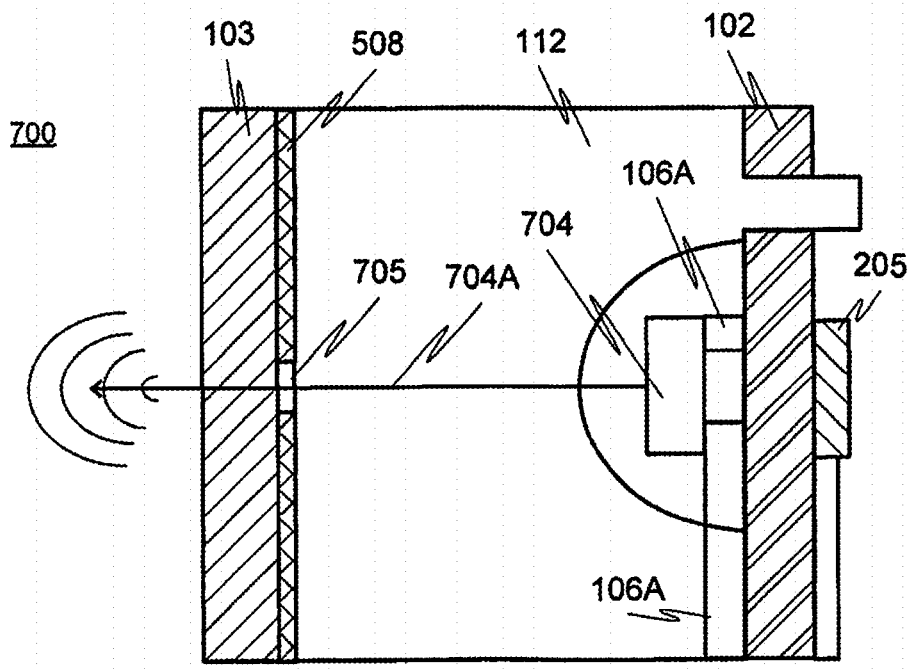
FIG. 7 illustrates a further embodiment of the multilayer structure.

FIG. 7 illustrates, at 700, a further, 'direct light' or 'direct lighting' involving embodiment of the multilayer structure. Especially, the light-emitting electronic component such as e.g. top-emitting LED, 704 has been provided on the first side of film 102 while at least some switch circuitry such as electrode 205 has been provided on the second side. Yet, a graphics layer 508 has been provided on the second film 103 in the front portion of the multilayer structure 700. Item 705 may refer to icon or other visual/optical feature, e.g. an opening or substantially transparent or translucent portion, in the layer 508 that may generally be substantially opaque having regard to the light emitted by the component 704, for example. The light 704A is now directly emitted from the source 704 to the environment via the intermediate elements such as molded layer 112 in contrast to the previous examples. The first and second sides of the film 102 may be separately electrically connected to external element(s), and/or again, conductive via(s) through the film 102 may be utilized to electrically connect the both sides together.

A person skilled in the art will ready comprehend the fact that the above, merely exemplary, embodiments of the present invention may be flexibly and easily combined in terms of selected features to come up with further embodiments. Yet, further features may be introduced into the above or mixed embodiments with reference to e.g. molded layer(s) provided onto the second side of the film 102 as discussed hereinelsewhere.

Figure 8:
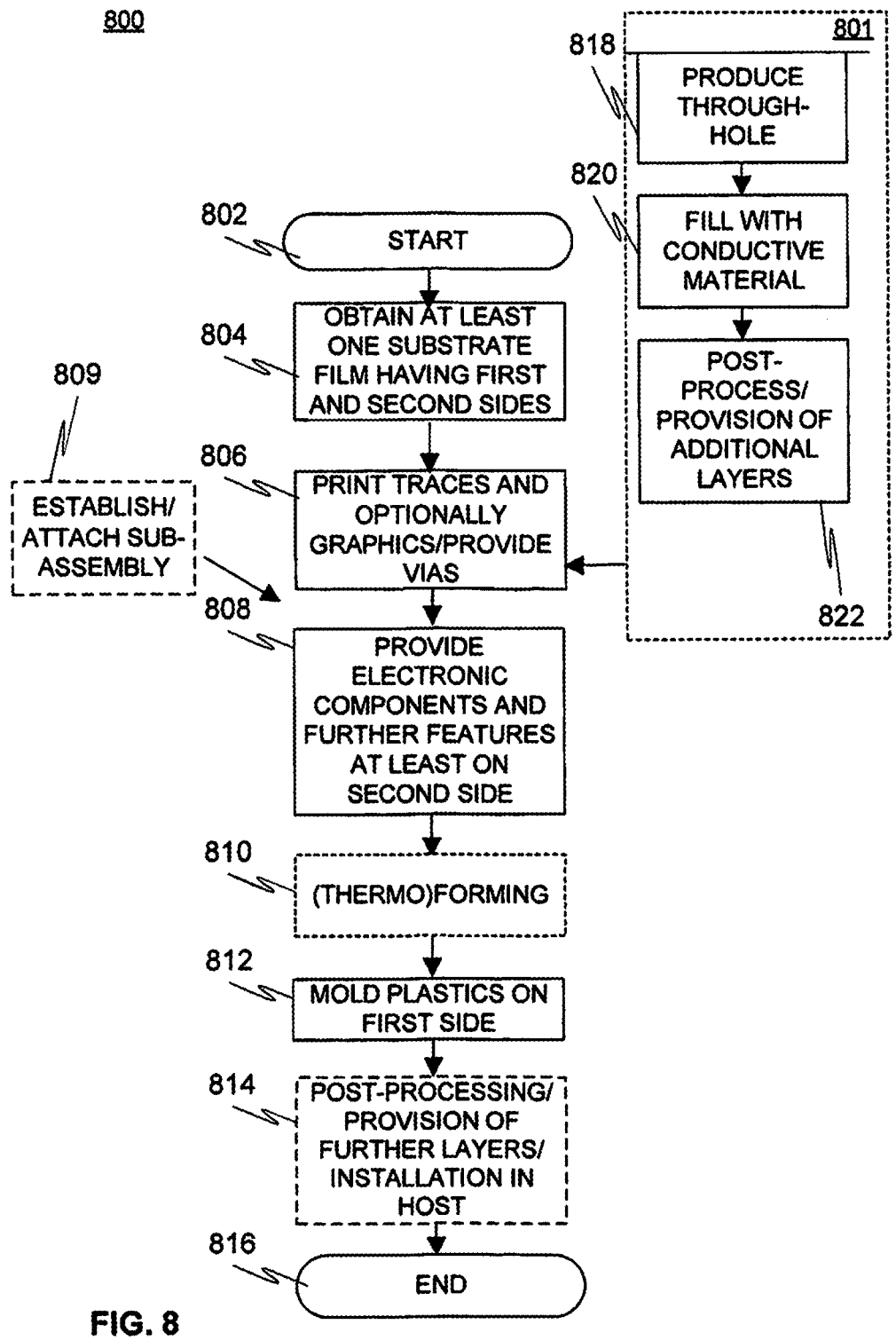
FIG. 8 is a flow diagram disclosing an embodiment of a method in accordance with the present invention.

FIG. 8 shows a flow diagram 800 disclosing an embodiment of a method for manufacturing a multilayer structure in accordance with the present invention.

At the beginning of the method for manufacturing the multilayer structure, a start-up phase 802 may be executed. During start-up 802, the necessary tasks such as material, component, equipment and tools selection, acquisition, calibration and other configuration may take place. Specific care must be taken that the design, component and material selections work together and survive a selected manufacturing process, which is naturally preferably checked up-front on the basis of the manufacturing process specifications and e.g. component data sheets, or by investigating and testing a number of produced prototypes, for example. The used equipment such as molding/IML, lamination, bonding, (thermo)forming, electronics assembly, cutting, drilling and/or printing equipment, among others, may be thus ramped up to operational status already at this stage or later.

At 804, at least one substrate film for accommodating electronics is obtained. As contemplated hereinbefore, in some embodiments only one substrate film is required whereas in some others, multiple substrate films of potentially different materials are included in the multilayer structure. Not necessarily all films ultimately required will carry circuitry though. A ready-made element, e.g. a roll or sheet of plastic film, may be acquired for use as substrate material. In some embodiments the substrate film itself may be first produced in-house by molding or other methods from the desired starting material(s). A substrate film may be substantially homogenous and contain essentially one material layer only, or alternatively, it may contain multiple layers of different materials laminated together to form a related stack. Initially the substrate film may be substantially flat (essentially two-dimensional, meaning considerably modest thickness compared with length and width).

At 806, a number of conductors such as conductor traces, electrodes and/or contact pads for electrically coupling electronic components, may be selectively provided on the film(s) with reference to various feasible multilayer constructions already reviewed hereinbefore, preferably by one or more techniques of printed electronics technology. For example, screen, inkjet, flexographic, gravure or offset lithographic printing may be utilized. Also further actions cultivating the film(s) involving e.g. printing of graphics, visual indicators, etc. on the film(s) may take place here. In some embodiments, graphics layers or masking layers may be, in addition to or instead of printing on a substrate, provided by laminating a separate graphics/opaque film or sheet onto the concerned substrate.

At 801, a method for providing electrical connection through a substrate film is generally depicted. This concerns embodiments, wherein first and second sides of the film should be electrically connected to each other to couple the related electronics, and/or where the electronics on both sides should be connected to external element (e.g. power source, processor, or communication element), which may be done solely via the second side provided that the first side is further electrically coupled to the second one.

First, a through-hole with e.g. angular, round or elongated (slit) cross-sectional shape may be provided in the film at 818 by drilling or cutting, for example. In some other embodiments the film may be molded or otherwise manufactured so as to directly contain the through-hole therein. At 820, the through-hole is filled with conductive material such as silver ink utilizing e.g. printed electronics technology. Alternatively, a conductive element such as a rod, wire or (flex) cable may be inserted in the hole. Care shall be preferably taken to ensure that the fill material or element matches the hole dimensions accurately to avoid undesired penetration of plastic material through the hole during subsequent molding. At 822, the conductive via(s) established may be post-processed and provided with a number of further material layers such as protective barrier layers. Instead of or in addition to electrically conductive vias, optical or other functional connections may be established in a similar fashion by disposing e.g. optical fiber in a hole extending through the substrate film.

At 808, a number of electronic components are provided, by mounting and/or printing, onto the film(s). Preferably at least the film residing, when in use, in the back thus going to have a molded layer in front between the user/use environment and itself, is provided, at least on the second, i.e. back side thereof, with e.g. a LED or switch circuitry, whereas the first side thereof may also contain a number of components and/or other circuitry, or remain free therefrom depending on the particular embodiment in question.

Ready-made components such as various SMDs may be attached to the contact areas on a substrate by solder and/or adhesives. Alternatively or additionally, printed electronics technology may be applied to actually manufacture at least part of the components, such as OLEDs, directly onto the film(s).

Yet, various further features such as lightguides or other optical elements may be provided to the film(s) at this stage or in connection with item 806 through mounting or direct fabrication via printing, for example.

Also connecting element(s) such as electrical connectors or contact pads for electrically connecting the multilayer structure to an external device, such as a host device, may be prepared e.g. to the second (back) side of the substrate film.

Execution of various method items such as items 806 and 808 may in practice alternate or overlap in various embodiments as being clear to a person skilled in the art in the light of the previously described embodiments illustrated in FIGS. 1-7. For example, one side of a substrate may be first provided with traces, components and further features, even molded layer (see item 812), prior to switching over to processing the opposite side potentially also including similar tasks.

Item 809 refers to possible attachment of one or more sub-systems or 'sub-assemblies' to the substrate film(s). The sub-assemblies may incorporate an initially separate, secondary substrate provided with electronics such as IC(s) and/or various components. At least part of the electronics of the multilayer structure may be provided to the substrate film(s) via such sub-assembly. Optionally, the sub-assembly may be at least partially overmolded by a protective plastic layer and/or covered by other material (e.g. epoxy) prior to attachment to the main substrate. For example, adhesive, pressure and/or heat may be used for mechanical bonding of the sub-assembly with the primary (host) substrate. Solder, wiring and conductive ink are examples of applicable options for providing the electrical connections between the elements of the sub-assembly and with the remaining electrical elements on the host substrate.

At 810, one or more substrates preferably already containing the electronics such as various components and/or other circuitry are optionally formed to at least locally exhibit a desired, essentially three-dimensional, shape instead of the initial substantially planar one. Applicable forming methods include e.g. thermoforming and cold forming.

At 812, at least one, e.g. thermoplastic or thermosetting, material layer is molded upon the first side of the first substrate film to at least cover the related surface and potential features thereon, such as traces, components and/or a graphics layer. In some embodiments where a second film has been provided, optionally incorporating e.g. graphics, the plastic layer(s) may be molded between them. Alternatively, the second film may be afterwards laminated onto the molded layer in the front portion of the multilayer structure. Applicable molding techniques include e.g. injection molding (thermoplastic) and reaction injection molding (thermosets).

In practice, a substrate film may be used as an insert e.g. in an injection molding process. In case two (first and second) films are used, both of them may be inserted in their own mold halves so that the plastic layer is injected between them.

Optionally, also the second side of the first substrate film may be at least partially overmolded e.g. to embed the electronics thereon within the plastic material for protection or other reason. The order of successive molding operations may be selected by a skilled person so as to best fit each embodiment and related use scenario.

Optionally, one or more spacing elements may be utilized in connection with the molding procedure to guide, protect and/or separate selected features (electronics, vias/through-holes, optics, etc.) on the substrate film(s) from the molded plastics and/or mold structures such as walls during molding to keep them clean from molded material and/or reduce stress induced thereto. Such spacing elements may be then removed or peeled off afterwards.

To protect fragile features such as electronic components, the utilized overmolding technique may exploit relatively low molding pressure (e.g. 15 bars or less, more preferably about 10 bars or less). In less sensitive portions higher pressures may be utilized to yield different material properties.

In addition to or instead of overmolding, selected electronic components and/or other features may be protected by potting or resin dispensing, for example.

Regarding the resulting overall thickness of the obtained stacked structure, it heavily depends on the used materials and related minimum material thicknesses providing the necessary strength in view of the manufacturing and subsequent use. These aspects have to be considered on case-by-case basis. For example, the overall thickness of the structure could be about one or a few millimeters, but considerably thicker or thinner embodiments are also fully feasible.

Item 814 refers to potential post-processing tasks. Further layers may be added into the multilayer structure by lamination or suitable coating (e.g. deposition) procedure. The layers may be of protective, indicative, tactile and/or aesthetic value (graphics, colors, figures, text, numeric data, surface profile, etc.) and contain e.g. textile, leather or rubber materials instead of or in addition to further plastics. Additional elements such as electronics or connecting elements (e.g. electrical wiring, cabling) may be installed at the outer surface(s) of the structure, such as the exterior surface of the substrate film in the back portion of the structure. Shaping/cutting may take place. The connecting elements may be connected to a desired external element such a connector of an external host device or host structure. The multilayer structure may be installed in a target device or structure (e.g. housing), if any.

At 816, method execution is ended.

The scope of the present invention is determined by the attached claims together with the equivalents thereof. A person skilled in the art will appreciate the fact that the disclosed embodiments were constructed for illustrative purposes only, and other arrangements applying many of the above principles could be readily prepared to best suit each potential use scenario. For instance, instead of or in addition to molding the plastics directly onto the substrate, the plastic layer could be prepared upfront and then attached to the substrate by suitable lamination technique applying e.g. adhesive, mechanical attachment means (screws, bolts, nails, etc.), pressure and/or heat. Finally, in some scenarios, instead of molding, the plastic or other layer of similar function could be produced on the substrate using a suitable deposition or further alternative method. Yet, instead of printed traces, the traces could be produced/provided otherwise. E.g. a conductor film manufactured utilizing etching, among other options, could be applied.

The invention claimed is:

1. An integrated multilayer structure comprising:
a first substrate film having a first side and an opposite second side, the first substrate film comprising an electrically insulating material, the second side having a number of electrical conductors thereon that exhibit predetermined characteristics at selected wavelengths;
a plastic layer on the first side of the first substrate film so as to at least partially cover the first side of the first substrate film;
an embedded color or graphics layer exhibiting a selected color, figure, icon, graphical pattern, symbol, text, numeric, alphanumeric, and/or other visual indication feature; and
circuitry provided on at least one of the first and second sides of the first substrate film, the circuitry including at least one electronic component selected from the group consisting of: an optoelectronic component, a microcontroller, a microprocessor, a signal processor, a digital signal processor, a sensor, a switch, a touch switch, a proximity switch, a programmable logic chip, a memory, a transistor, a resistor, a capacitor, an inductor, a capacitive switch, a memory array, a memory chip, a data interface, a transceiver, a wireless transceiver, a transmitter, a receiver, a wireless transmitter, and a wireless receiver, the circuitry further including at least one conductor, the circuitry being functionally connected to the first side of the first substrate film, wherein the plastic layer on the first side of the first substrate film and the at least one electronic component on the second side of the first substrate film while being functionally connected to the first side of the first substrate film defines a first configuration of the multilayer structure, the first substrate film having a planar arrangement in the first configuration, and wherein the multilayer structure is configured to transition from the first configuration to a second configuration of the multilayer structure, the second configuration different from the first configuration, the multilayer structure configured to be retained in the second configuration, the first substrate film having a non-planar arrangement in the second configuration.

2. The integrated multilayer structure of claim 1, further comprising a second substrate film on a side of the plastic layer facing away from the first substrate film.

3. The integrated multilayer structure of claim 2, wherein the second substrate film has a first and opposite second side, the second side facing the molded plastic layer and having a number of features.

4. The integrated multilayer structure of claim 1, wherein the number of electrical conductors are printed on the second side of the first substrate film.

5. The structure of claim 4, wherein at least part of the conductors are optically transparent at the selected wavelengths.

6. The integrated multilayer structure of claim 1, wherein the circuitry comprises a light source, the structure further comprising a lightguide provided on the second side of the first substrate film to direct light emitted by the light source and incoupled to the lightguide to propagate therewithin and exit through a selected surface towards the first substrate film and plastic layer, wherein the first substrate film and plastic layer comprise optically transmissive material being at least translucent material, having regard to the wavelengths emitted by the light source.

7. The integrated multilayer structure of claim 1, wherein at least some of the circuitry is provided on the first side of the first substrate film and is at least partially embedded in the plastic layer, and wherein the at least one electronic component includes a light source.

8. The integrated multilayer structure of claim 1, wherein a number of electrical conductors are printed on the first side of the first substrate film and connected to at least one component provided thereon, wherein at least part of the conductors are optically transparent at selected wavelengths.

9. The integrated multilayer structure of claim 1, wherein at least the first substrate film exhibits a formed, three-dimensional, non-planar shape at least locally.

10. The integrated multilayer structure of claim 1, further comprising an electrically conductive via extending through the first substrate film, connecting circuitry on both sides thereof.

11. The integrated multilayer structure of claim 1, further comprising a protective layer on the second side of the first substrate film, the material of the protective layer being different from the material of the plastic layer.

12. The integrated multilayer structure of claim 1, wherein the circuitry comprises at least one feature selected from the group consisting of: electronic component, electro-optical component, electromechanical component, radiation-emitting component, light-emitting component, LED (light-emitting diode), OLED (organic LED), radiation detecting component, light-detecting component, photodiode, phototransistor, photovoltaic device such as cell, sensor, atmospheric sensor, gas sensor, temperature sensor, moisture sensor, micromechanical component, switch, touch switch, proximity switch, touch sensor, proximity sensor, capacitive switch, capacitive sensor, projected capacitive switch or sensor, single-electrode capacitive switch or sensor, multi-electrode capacitive switch or sensor, self-capacitance sensor, mutual capacitive sensor, inductive sensor, sensor electrode, UI (user interface) element, user input element, vibration element, communication element, data processing element, and data storage element.

13. The integrated multilayer structure of claim 1, wherein the plastic layer comprises at least one material selected from the group consisting of: elastomeric resin, thermoplastic material, PC, PMMA (Polymethyl methacrylate), ABS, PET, copolyester, copolyester resin, nylon (PA, polyamide), PP (polypropylene), TPU (thermoplastic polyurethane), polystyrene (GPPS), TPSiV (thermoplastic silicone vulcanizate), and MS resin.

14. The integrated multilayer structure of claim 1, further comprising a cooling element on the second side of the first substrate film configured to control the temperature of the circuitry.

15. The integrated multilayer structure of claim 1, further comprising, on the second side of the first substrate film, a spacer configured to protect at least part of the circuitry during molding of the plastic layer or afterwards, wherein the spacer contains a hole for accommodating said at least part of the circuitry.

16. The structure of claim 1, wherein circuitry on any side of the first substrate film comprises a number of electrically conductive elements provided with cutouts to enable light to pass through.

17. The structure of claim 1, wherein the first substrate film is a thermoplastic.

18. The structure of claim 1, wherein the circuitry is provided on both the first and second sides of the first substrate film.

19. A host device comprising:
a body; and
an integrated multilayer structure disposed within the body, the integrated multilayer structure including:
a first substrate film having a first side and an opposite second side, the first substrate film comprising an electrically insulating material, the second side having a number of electrical conductors thereon that exhibit predetermined characteristics at selected wavelengths;
a plastic layer on the first side of the first substrate film so as to at least partially cover the first side of the first substrate film;
an embedded color or graphics layer exhibiting a selected color, figure, icon, graphical pattern, symbol, text, numeric, alphanumeric, and/or other visual indication feature; and
circuitry provided on at least the second side of the first substrate film, the circuitry including at least one electronic component selected from the group consisting of: an optoelectronic component, a microcontroller, a microprocessor, a signal processor, a digital signal processor, a sensor, a switch, a touch switch, a proximity switch, a programmable logic chip, a memory, a transistor, a resistor, a capacitor, an inductor, a capacitive switch, a memory array, a memory chip, a data interface, a transceiver, a wireless transceiver, a transmitter, a receiver, a wireless transmitter, and a wireless receiver the circuitry being functionally connected to the first side of the first substrate film, wherein the plastic layer on the first side of the first substrate film and the at least one electronic component on the second side of the first substrate film while being functionally connected to the first side of the first substrate film defines a first configuration of the multilayer structure, the first substrate film having a planar arrangement in the first configuration, and wherein the multilayer structure is configured to transition from the first configuration to a second configuration of the multilayer structure, the second configuration different from the first configuration, the multilayer structure configured to be retained in the second configuration, the first substrate film having a non-planar arrangement in the second configuration.

20. The host device of claim 19, further comprising at least one element selected from the group consisting of: electronic terminal device, personal electronic device, portable terminal device, hand-held terminal device or controller, vehicle, car, truck, airplane, helicopter, in-vehicle structure, in-vehicle panel, in-vehicle electronic device, vehicle dashboard, vehicle exterior element, vehicle lighting device, measurement device, computer device, intelligent garment, piece of wearable electronics, multimedia device or player, industrial machinery, controller device, and personal communications device.

21. The host device of claim 19, wherein the circuitry is positioned on the first and second sides of the first substrate film based on at least one functional characteristic or requirement of at least one of the components of the circuitry.

* * * * *